United States Patent
Antheunisse et al.

(10) Patent No.: US 6,289,472 B1
(45) Date of Patent: Sep. 11, 2001

(54) METHOD AND TEST SYSTEM FOR TESTING UNDER A PLURALITY OF TEST MODES

(75) Inventors: William J. Antheunisse, Rowlett; Joseph W. Whitaker, Richardson, both of TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/123,699

(22) Filed: Jul. 28, 1998

Related U.S. Application Data
(60) Provisional application No. 60/055,406, filed on Aug. 7, 1997.

(51) Int. Cl.[7] .................................................. H02H 3/05
(52) U.S. Cl. ........................ 714/25; 714/28; 714/724; 714/728; 714/731
(58) Field of Search ........................ 712/1, 11; 714/25, 714/38, 724, 728, 731

(56) References Cited

U.S. PATENT DOCUMENTS

| | | | |
|---|---|---|---|
| 4,159,534 | * 6/1979 | Getson, Jr. et al. | 714/32 |
| 4,481,627 | * 11/1984 | Beauchesne et al. | 714/718 |
| 5,235,271 | * 8/1993 | Kira | 324/765 |
| 5,581,463 | * 12/1996 | Constant et al. | 705/400 |
| 5,752,032 | * 5/1998 | Keller et al. | 709/301 |
| 6,028,439 | * 2/2000 | Arkin et al. | 324/765 |
| 6,047,389 | * 4/2000 | Thai | 714/38 |
| 6,052,810 | * 4/2000 | Creek | 714/710 |

* cited by examiner

*Primary Examiner*—Richard Hjerpe
*Assistant Examiner*—Mackly Monestime
(74) *Attorney, Agent, or Firm*—Pedro P. Hernandez; W. James Brady, III; Frederick J. Telecky

(57) ABSTRACT

A testing system includes a testing hardware subsystem which can perform testing under a plurality of testing modes. Each testing mode corresponds to the operation of a particular version of a tester. A control subsystem is coupled to the testing hardware subsystem. The control subsystem can direct the testing hardware subsystem to test under one of the plurality of testing modes at a given moment.

12 Claims, 3 Drawing Sheets

METHOD AND TEST SYSTEM FOR TESTING UNDER A PLURALITY OF TEST MODES

This application claims priority under 35 USC §119 (e) (1) of provisional application number 60/055,406, filed Aug. 7, 1997.

TECHNICAL FIELD OF THE INVENTION

This invention relates generally to testing systems and methods, and more particularly to testing with multiple modes.

BACKGROUND OF THE INVENTION

In many industries, testing systems ("testers") are utilized to test a product, for example, at various points during manufacture. Such testers may be refined over time as different embodiments or versions. Often, when a new version of a tester is created, it will not be compatible—i.e., capable of being used—with previous versions because the new version may comprise components which differ from the older versions. Furthermore, newer versions often do not operate in the same manner as previous versions. This gives rise to numerous problems.

For example, testing under a new version of a tester may so completely differ from testing under a previous version that separate operating techniques and/or software is required. Thus, when a new version of a tester is brought into a production facility which already utilizes previous versions of that same tester, new software and operating methods must be developed or learned in order to use the new version. Valuable resources, such as the time of operators and programmers, must be expended during the necessary development and learning.

Furthermore, a new version of a tester may not be able to perform exactly the same tests as an older version. Thus, in some cases, if a specific test is required, one version of a tester may not be used if that test can only be performed by another version. Accordingly, some versions of a tester may be idle even when other versions are being over-worked.

SUMMARY OF THE INVENTION

In accordance with the present invention, the disadvantages and problems associated with prior testers and corresponding techniques for their use have been substantially reduced or eliminated.

According to an embodiment of the present invention, a testing system includes a testing hardware subsystem which can perform testing under a plurality of testing modes. Each testing mode corresponds to the operation of a particular version of a tester. A control subsystem is coupled to the testing hardware subsystem. The control subsystem can direct the testing hardware subsystem to test under one of the plurality of testing modes at a given moment.

According to another embodiment of the present invention, a method for testing includes the following steps: receiving specification information and testing routine information; processing the specification information and testing routine information in order to generate programming information; initializing a testing hardware subsystem using the programming information so that the testing hardware subsystem can perform testing under a plurality of testing modes, each testing mode corresponding to the operation of a particular version of a tester; and directing the testing hardware subsystem to test under one of the plurality of testing modes at a given moment.

Important technical features of the present invention include providing a testing system with multiple testing modes, wherein each testing mode may correspond to the operation of a particular version of the same tester. The different testing modes allow product to be moved and tested on any testing system with available capacity, thereby reducing the likelihood that the testing system will be idle because it is unable to test under a particular mode.

Yet another important technical advantage of the present invention includes providing flexibility with regard to testing decisions. During a particular session or execution of testing, the testing system may be run in any one or more of the various testing modes, thereby taking advantage of the efficiencies provided by or inherent to different versions of the tester. Alternatively, a single testing mode may be specified so that a user, such as an operator, can operate the tester in a testing mode for which he or she is trained or familiar.

Other technical advantages are readily apparent to one skilled in the art from the following figures, description, and claims.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION OF THE INVENTION

The preferred embodiment of the present invention and its advantages are best understood by referring to FIGS. 1–4 of the drawings, like numerals used for like and corresponding parts of the various drawings.

Figure 1:
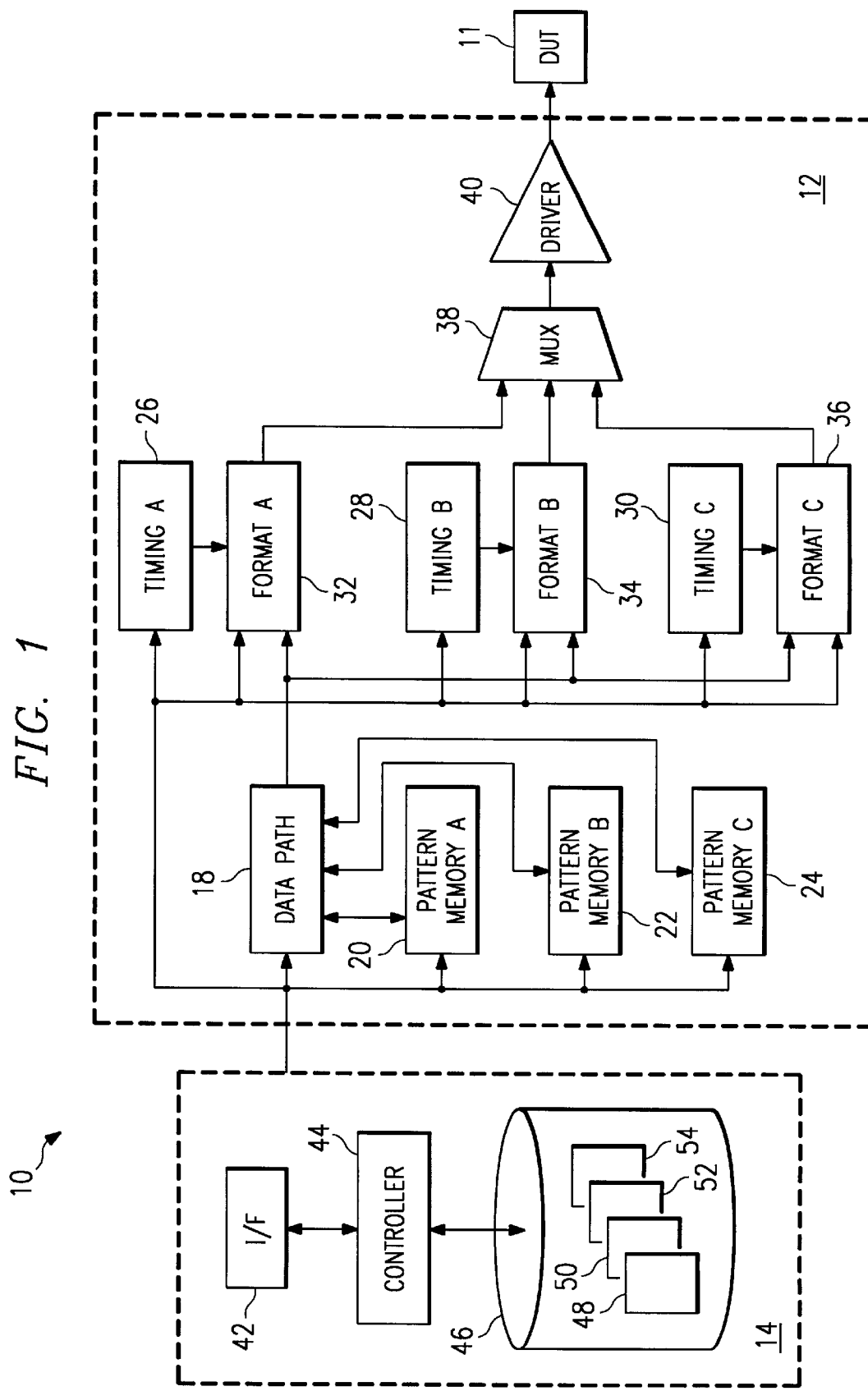
FIG. 1 is a block diagram of an exemplary testing system with multiple modes, in accordance with an embodiment of the present invention.

FIG. 1 illustrates an exemplary testing system 10 having multiple modes, in accordance with the present invention. In one embodiment, each of these modes may correspond to the operation of a particular version of the same tester, as explained below in more detail. Generally, testing system 10 can test various functional and/or operational aspects of a device under test (DUT) 11. As described herein, device under test 11 may be a semiconductor chip into which testing system 10 inputs test patterns. It should be understood, however, that the present invention is not so limited and is intended to encompass any testing system or technique which tests under multiple modes. Testing system 10 includes a testing hardware subsystem 12 and a control subsystem 14.

Testing hardware subsystem 12 comprises various hardware components for testing. As shown, these hardware components include a data path module 18, pattern A memory module 20, pattern memory B module 22, pattern C memory module 24, timing A module 26, timing B module 28, timing C module 30, format A module 32, format B module 34, format C module 36, multiplexer (MUX) 38, and driver 40.

Pattern memory modules 20–24 each functions to store or contain various test patterns which can be used to test device under test 11. Data path 18 is coupled to pattern memory modules 20–24 and is operable to route the test patterns stored therein to any of format modules 32–36. Each of format modules 32–36 functions to format or otherwise process the test patterns which it receives so that these patterns can be input into device under test 11. Timing modules 26–30 are each coupled to a corresponding format module 32–36. Each timing module 26–30 supports timing for the operation of its corresponding format module 32–36. Multiplexer 38 functions to multiplex the outputs of format modules 32–36. Driver 40 is coupled to multiplexer 38 and is operable to input the multiplexed testing patterns into device under test 11.

It should be understood that testing hardware subsystem 12 may comprise other hardware components in addition to, or instead of, the exemplary components described herein. Thus, in another embodiment, for example, testing hardware subsystem 12 may comprise one or more hardware components which are operable to analyze information output by device under test 11, rather than to input test patterns into the same. Alternatively, testing hardware subsystem 12 may comprise a combination of both kinds of hardware components.

At least a portion of the hardware components in testing hardware subsystem 12 may be associated with different versions of the same tester, wherein operation under each version constitutes a different mode of testing for testing system 10. In particular, pattern memory A module 20, timing A module 26, and format A module 32 may be associated with a first version of a particular tester and support a testing mode A. Likewise, pattern memory B module 22, timing B module 28, and format B module 34 may be associated with a second version of the same tester and support a testing mode B. Pattern memory C module 24, timing C module 30, and format C module 36 may be associated with a third version of the tester and support testing mode C. The components in testing hardware subsystem 12 which support a particular testing mode may operate independently from the components supporting other testing modes. Furthermore, in some embodiments, the same component can be used to support different testing modes, thereby reducing the hardware components needed to provided multiple testing modes.

Control subsystem 14 is coupled to testing hardware subsystem 12. Control subsystem 14 generally functions to control or manage the operation of testing system 10. Control subsystem 14 may initialize testing system 10 by programming the hardware elements of testing hardware subsystem 12. Furthermore, control subsystem 14 may cause testing system 10 to execute tests after the system has been initialized. As shown, control subsystem 14 comprises an interface 42, a controller 44, and a memory 46.

The functionality of interface 42 can be performed by one or more suitable input devices, such as a keypad, touch screen, input port, pointing device (e.g., mouse), and/or other device that can accept information, and one or more suitable output devices, such as a computer display, output port, speaker, or other device for conveying information associated with the operation of testing system 10, including digital data, visual information, or audio information. Interface 42 may receive instructions from an operator or user of testing system 10, such as a process engineer. Furthermore, interface 42 can receive specification information 48 and testing routine information 50 which are used to initialize or set up testing hardware subsystem 12.

Specification information 48 comprises information relating to various specifications, such as frequency, timing restrictions, format, etc., for one or more test patterns, which can be the test patterns contained in pattern memory modules 20–24 of testing hardware subsystem 12. For example, one test pattern may require testing at a frequency at least 100 MHZ and testing under a first format. Another test pattern may require testing at only 150 MHZ and testing under a second format. In one embodiment, separate specification information 48 may be provided for each test pattern contained in pattern memory modules 20–24.

Testing routine information 50 comprises information relating to various testing routines, each of which may utilize one or more test patterns to test a device under test 11. Separate testing routine information 50 may be provided for each testing routine. For each testing routine, testing routine information 50 may specify all of the test patterns utilized by that testing routine.

Memory 46 may reside in a suitable storage medium, such as random access memory (RAM), read-only memory (ROM), disk, tape storage, or other suitable volatile and/or non-volatile data storage system. Memory 46 can be a relational database. Memory 46 may receive, store, and forward various information. This information may include the specification information 48 and testing routine information 50 previously described, as well as testing mode information 52.

Testing mode information 52 generally comprises various information relating to the different testing modes which are supported by testing hardware subsystem 12. Separate testing mode information 52 can be maintained for each testing mode. Testing mode information 52 may specify each hardware component of testing hardware subsystem 12 that is associated with a particular testing mode. Thus, for example, testing mode information 52 may specify the association of pattern memory A module 20, timing A module 26, and format A module 32 with testing mode A, the association of pattern memory B module 22, timing B module 28, and format B module 34 with testing mode B, and the association of pattern memory C module 24, timing C module 30, and format C module 36 with testing mode C. Furthermore, for each testing mode, testing mode information 52 may specify the limits or parameters within which the associated hardware components may operate. For example, timing A module 26 (associated with testing mode A) may operate at any frequency between 35 MHz to 200 MHZ; likewise, timing B module 28 (associated with testing mode B) may operate at any frequency between 75 MHz to 300 MHZ. Each testing mode may support one or more test patterns, such as those stored in pattern memory modules 20–24. Thus, testing mode information 52 may also specify all test patterns supported by the various testing modes. In one embodiment, testing mode information 52 may comprise one or more tables which define or specify the relationships described above.

Controller 44 is coupled to interface 42 and memory 46. The functionality of controller 44 can be performed by any suitable processor, such as a main-frame, file server, work station, or other suitable data processing facility running appropriate software and operating under an appropriate operating system. Controller 44 may process information received at interface 42 in order to either initialize testing system 10 or execute testing. For example, controller 44 may process the specification and testing information received at interface 42 using testing mode information 52 retrieved from memory 46 in order to generate programming information 54. Programming information 54 generally comprises various information which is used to program the hardware components in testing hardware subsystem 12. In particular, programming information 54 may specify one or more software programs which, when compiled, enable the hardware components of testing hardware subsystem 12 to perform testing under one or more testing modes for each of a number of testing routines.

In operation, testing system 10 is first initialized using specification information 48 and testing routine information 50 received at interface 42 of control subsystem 14. In particular, controller 44 processes this information using testing mode information 52 (retrieved from memory 46) in order to identify the testing modes which are capable of supporting the various specifications and testing routines. From this analysis, control subsystem 14 generates programming information 54, which is then used to program the hardware elements in testing hardware subsystem 12. For each testing routine, all possible hardware elements which can be used to support that testing routine may be programmed. For example, if a particular testing routine may be operated or supported by either testing mode A or testing mode B, then pattern memory A module 20, timing A module 26, and format A module 32 may be programmed as well as pattern memory B module 22, timing B module 28, and format B module 34.

After initialization, testing system 10 can be utilized in order to test the functionality of a device under test 11. Specifically, an operator may select one or more testing routines to test the operation or function of device under test 11. Each testing routine may invoke or use various testing patterns which are input into the device. Testing system 10 may switch from one testing mode into another to perform each of the testing routines required under a particular execution or session of testing. In particular, as testing is executed, different hardware components, corresponding to the different testing modes, may activate; preferably, at any given moment during the testing session the most optimal hardware components may be used. Accordingly, the present invention provides testing under multiple modes. These multiple testing modes can support compatibility with other testing systems, such as different versions of a particular type of tester. This provides flexibility in testing so that, for example, product to be tested can be moved from another tester to testing system 10.

Figure 2:
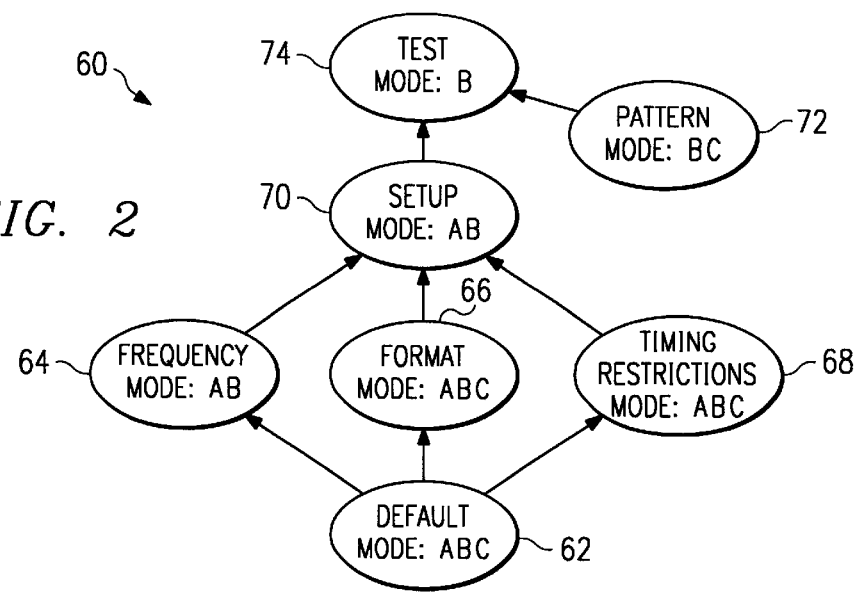
FIG. 2 illustrates an exemplary, hierarchical flow process by which a number of testing modes are considered against one or more specifications and test patterns so that a device under test may be tested, in accordance with an embodiment of the present invention.

FIG. 2 illustrates an exemplary, hierarchical flow process 60 by which a number of testing modes are considered against one or more specifications and test patterns so that a device under test may be tested. In one embodiment, flow process 60 represents a process whereby control subsystem 14 of testing system 10 may analyze various testing modes in order to initialize the testing system and perform testing of a device under test. Flow process 60 comprises a number of stages 62–74 at which processing is performed. Each processing stage may occur at one of a number of different levels in the hierarchical structure of flow process 60.

At the lowest level in flow process 60, a number of default testing modes are initially provided at processing stage 62. As shown, these default testing modes can be mode A, mode B, and mode C. From processing stage 62, flow process 60 progresses to the next level, which comprises processing stages 64–68. At each of processing stages 64–68, the default testing modes are considered against various specifications. Each of the specifications at processing stages 64–68 may or may not be compatible with (i.e., supported by) the default testing modes provided at processing stage 62. For each processing stage 64–68, if a default testing mode is incompatible with the specification of that processing stage, such testing mode is eliminated from further consideration.

Thus, for example, at processing stage 64, the default testing modes are analyzed against a frequency specification (e.g., 100 MHZ or 150 MHZ) to determine compatibility. As shown, only testing modes A and B are capable of supporting the particular frequency specification; accordingly, testing mode C is eliminated. Likewise, at processing stage 66, default testing modes A, B, and C are analyzed against a format specification.

As shown, all of the default testing modes are capable of supporting the particular format, and, accordingly, none of the testing modes are eliminated at processing stage 66. At processing stage 68, the default testing modes are analyzed against a timing restriction specification. As illustrated, all testing modes support the particular timing restriction specification, and, thus, none are eliminated.

From processing stages 64–68, flow process 60 progresses to the next level of processing. This level comprises processing stage 70, where testing system 10 is initialized or set-up. In particular, the hardware components in testing hardware subsystem 12 may be programmed for each of the testing modes which were not eliminated at the previous processing stages 64–68. Recalling the previous description, only mode C was eliminated at any of processing stages 64–68. Thus, the hardware components supporting testing modes A and B are programmed at processing stage 70. After initialization, the programs are compiled and, thus, testing system 10 is made ready for testing.

At processing stage 72, various testing modes are analyzed against a testing pattern to determine compatibility therebetween. If a particular testing mode is incapable of supporting the testing pattern, then it is eliminated from consideration at this stage. As shown, testing modes B and C support the testing pattern being contemplated.

From processing stages 70 and 72, flow process 60 moves to the highest level of processing, which comprises processing stage 74. At processing stage 74, an appropriate testing mode is selected. The only mode which is capable of supporting the testing, as dictated by processing stages 70 and 72, is testing mode B; accordingly, testing mode B is selected. Testing under the selected mode is executed to test device under test It should be understood that the various levels of processing and corresponding processing stages described above are provided by way of example only. In alternate embodiments, a flow process may comprise other processing levels and stages in addition to, or instead of, the exemplary processing levels and stages shown in FIG. 2.

According to the present invention, flow process 60 may be utilized to determine a preferred testing mode for a particular testing routine. The preferred testing mode may correspond to the operation of the testing hardware components which are optimal or most suitable to perform testing. Flow process 60 can be repeated in order to determine a preferred mode for each testing routine. However, when actual testing is performed for a particular testing routine, the preferred testing mode for that routine need not be utilized (as explained below in more detail). Rather, a user, such as an operator, can choose another testing mode if so desired. For example, if the user is more familiar, and thus more comfortable, with a particular testing mode, he or she may select that testing mode rather the preferred mode. In this way, the present invention provides flexibility in testing.

Figure 3:
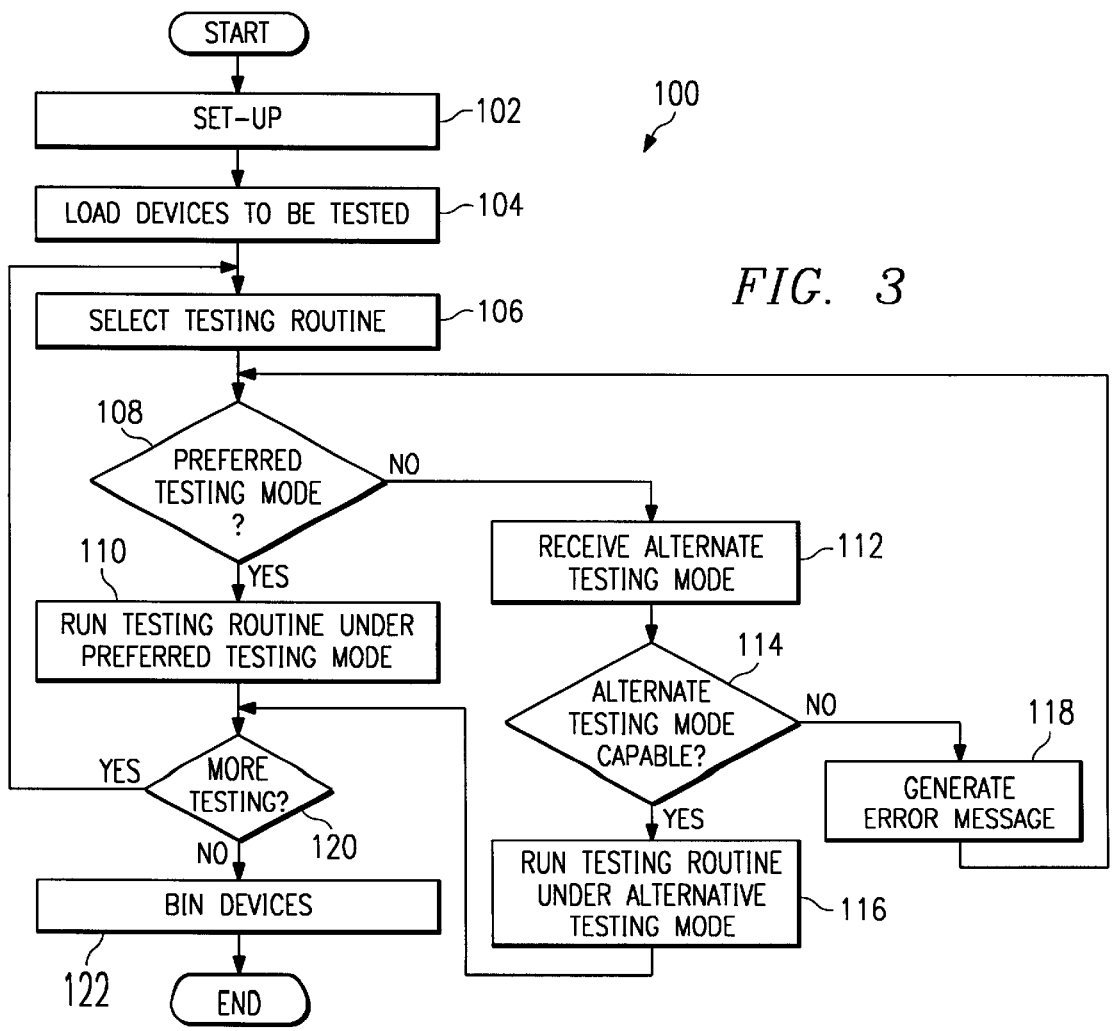
FIG. 3 is a flow chart of an exemplary method for testing under multiple modes, in accordance with an embodiment of the present invention.

FIG. 3 is a flow chart of an exemplary method 100 for testing under multiple modes, in accordance with an embodiment of the present invention. Method 100 may correspond to the operation of testing system 10 shown in FIG. 1.

Method 100 begins at step 102 where testing system 10 is initialized or set up. Initialization may include programming the hardware components of testing hardware subsystem 12 so that it is operable to perform testing. A flow chart of an exemplary method for this step of initialization is illustrated and described below in more detail with reference to FIG. 4.

After testing system 10 has been initialized, one or more devices may be loaded into testing system 10 at step 104. Each of these devices constitutes a device under test (DUT), such as device under test 11 shown in FIG. 1. Any of a number of testing routines may be performed upon each device under test. Each testing routine may invoke or utilize one or more test patterns to test specific functions, operations, or other aspects of the devices under test. These test patterns can be ones stored in one or more components of testing hardware subsystem 12, such as pattern memory modules 20–24.

At step 106, a testing routine is selected for the device to be tested. Although a preferred mode of testing may be provided for the selected testing routine, the preferred mode need not be used. Thus, at step 108, control subsystem 14 queries a user whether the preferred testing mode should be used to perform testing under the selected routine. If the user desires the preferred testing mode, then at step 110 control subsystem 14 directs testing hardware subsystem 12 to run the selected testing routine under the preferred testing mode. Method 100 then moves to step 120.

On the other hand, if the user does not desire to test under the preferred testing mode, the user may input an alternate testing mode, which is received by testing system 10 at step 112. At step 114, control subsystem 14 determines whether the alternate testing mode input by the user is capable of supporting the selected testing routine. If the alternate testing mode is capable, then at step 116 control subsystem 14 directs testing hardware subsystem 12 to run the testing routine under that testing mode, after which method 100 proceeds to step 120. However, if the alternate testing mode is not capable of supporting the selected testing routine, control subsystem 14 generates and displays an error message to the user at step 118; method 100 then returns to step 108 where control subsystem 14 queries the user whether the preferred testing mode should be used.

Method 100 may repeat 108–118 until the selected testing routine is run under either the preferred testing mode for that routine or an alternate testing mode that is capable of supporting the routine. When running a testing routine, control subsystem 14 directs the testing hardware of testing hardware subsystem 12 to input one or more testing patterns into each device under test 11.

After the current testing routine has been run, control subsystem 14 queries at step 120 whether more testing should be performed upon the devices under test. If more testing should be performed, then method 100 returns to step 106 where another testing routine is selected. Otherwise, if no more testing is required, the devices under test are binned at step 112, after which method 100 ends.

Figure 4:
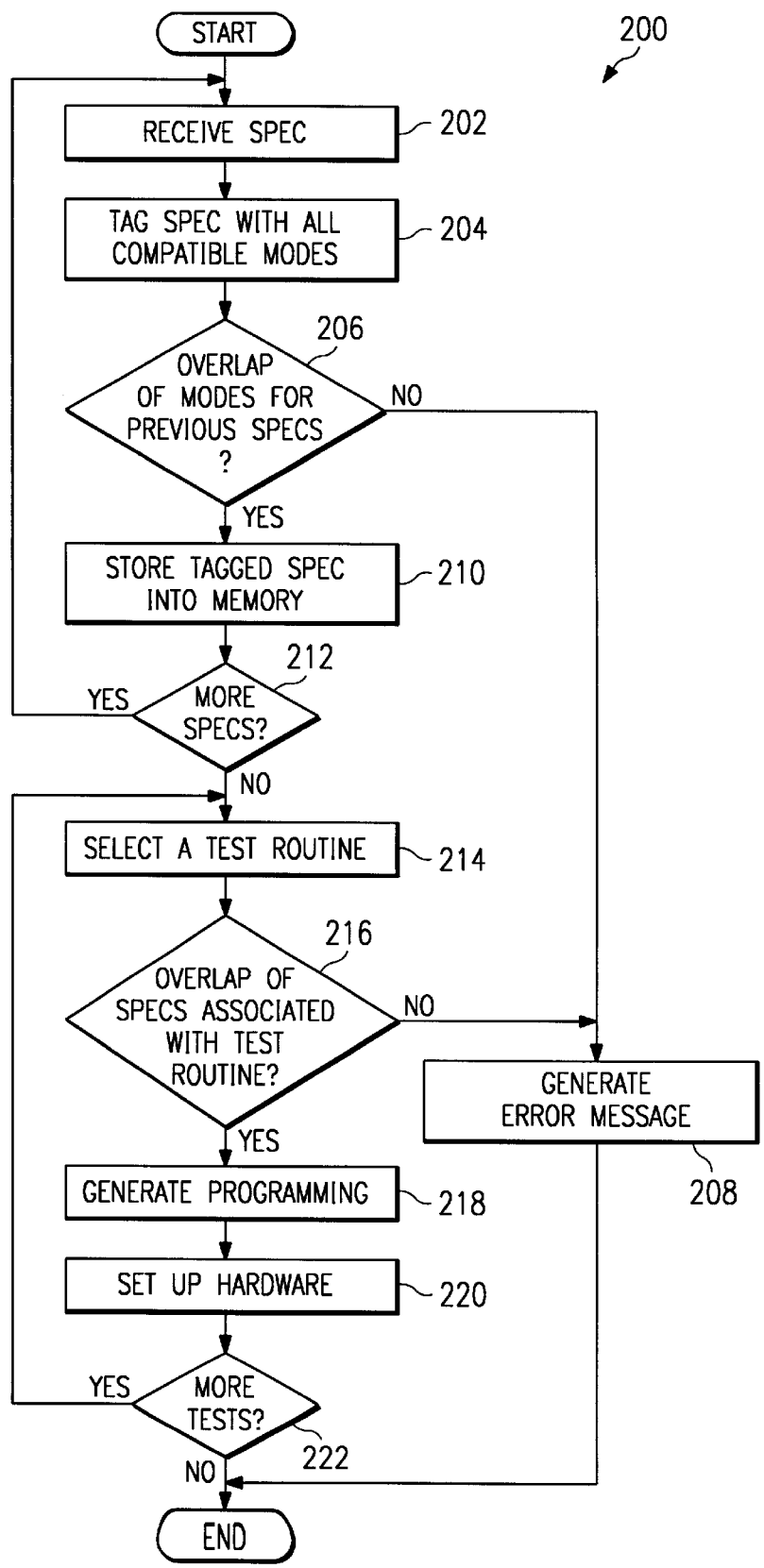
FIG. 4 is a flow chart of an exemplary method for setting up a testing system with multiple modes, in accordance with an embodiment of the present invention.

FIG. 4 is a flow chart of an exemplary method 200 by which testing system 10 may be set up, in accordance with the present invention. Method 200 may correspond to step 110 of method 100 shown in FIG. 3.

Method 200 begins at step 202 where interface 42 of control subsystem 14 receives a specification for some aspect of a testing routine, such as frequency, timing restrictions, voltage levels, etc. The specification may specify a certain value or range of values for the corresponding aspect. For example, a specification may specify a value of 100 MHZ for a frequency aspect. The received specification constitutes specification information 48 which is passed to controller 44.

At step 204, using testing mode information 52 retrieved from memory 46, controller 44 tags the specification currently being considered with all compatible testing modes. Specifically, each testing mode may be supported, at least in part, by dedicated components in testing hardware subsystem 12. Each of these components may operate within certain limits or parameters, which are specified by testing mode information 52. The step of "tagging" comprises identifying which dedicated hardware components are capable of supporting the value of the current specification and then creating a link or relationship between that specification and the testing mode associated with the identified hardware components.

At step 206, controller 44 determines whether at least one of the testing modes to which the current specification has been tagged overlaps with the modes that have been tagged for previous specifications. If there is no overlap with previous specifications, then testing system 10 would be inoperable to perform according to the required specifications because no single testing mode could be used. Consequently, at step 208 testing system 10 generates an error message, after which method 200 ends. Otherwise, if there is overlap of testing modes between the current specification and previously considered specifications, then at step 210 controller 44 stores the tag specification into a memory 46.

At step 212, controller 44 determines whether there are more specifications to be considered. If more specifications are to be considered, method 200 returns to step 202 where the another specification is received. Testing system 10 repeats steps 202–212 until there are no other specifications to be considered.

Testing system 10 then considers various testing routines, which may be specified within testing routine information 50 received at control subsystem 14. At step 214, a testing routine is selected from the received testing routine information. A testing routine may invoke or utilize one or more test patterns, each of which may be associated with a particular testing mode. From the processing performed at steps 202–212, each testing mode may be tagged to various specifications. Consequently, the testing routine under consideration can be related or associated with a number of specifications.

At step 216, controller 44 determines whether the specifications associated with the current testing routine overlap the specifications associated with testing routines that were previously considered. If there no overlap of specifications, then testing system 10 is unable to perform such testing routine; accordingly, at step 208 controller 44 generates an error message, after which method 200 ends. Otherwise, if there is an overlap of specifications between the current and previously considered testing routines, control subsystem 14 generates appropriate programming information 54. At step 220, control subsystem 14 uses the programming information to set up testing hardware subsystem 12 so that the testing hardware contained therein can run the current testing routine.

At step 222, controller 44 determines whether there are more testing routines to be considered. If there are more testing routines to be considered, method 200 returns to step 214 where another testing routine is selected. Testing system 10 cycles through steps 214–222 until all desired testing routines have been considered, and the appropriate testing hardware programmed. Method 200 then ends.

Although the present invention and its advantages have been described in detail, it should be understood that various changes, substitutions, and alterations can be made therein without departing from the spirit and scope of the invention as defined by the appended claims.

What is claimed is:

1. A testing system for testing functional and/or operational aspects of a device under test (DUT) comprising:
    a testing hardware subsystem comprising
        a first grouping of hardware components associated with a first version of a tester and operable to perform testing under a first testing mode corresponding to operation under the first version of the tester, and
        a second grouping of hardware components associated with a second version of the tester and operable to perform testing under a second testing mode corresponding to operation under the second version of the tester; and
    a control subsystem coupled to the testing hardware subsystem, the control subsystem operable to initialize the first and second groupings of hardware components, the control subsystem further operable to direct the testing hardware subsystem to test under one of the first and second testing modes at a given moment.

2. The testing system of claim 1, wherein the testing hardware subsystem further comprises a multiplexer coupled to the first and second groupings of hardware components, the multiplexer operable to multiplex outputs of the first and second groupings of hardware components.

3. The testing system of claim 1, wherein the control subsystem further comprises:
    an interface operable to receive specification information and testing routine information; and
    a controller coupled to the interface, the controller operable to process the specification information and testing routine information in order to generate programming information which can be used to program the testing hardware subsystem.

4. The testing system of claim 1, wherein the control subsystem is further operable to allow a user to select a testing mode for the testing hardware subsystem.

5. The testing system of claim 1, wherein the control subsystem further comprises a memory coupled to the interface and the controller, the memory operable to store testing mode information.

6. The testing system of claim 1, wherein the control subsystem is operable to generate programming information for initializing the testing hardware subsystem.

7. The testing system of claim 1, wherein the control subsystem is further operable to allow a user to select a testing mode for the testing hardware subsystem.

8. The testing system of claim 1, wherein the testing hardware subsystem further comprises:
    a first grouping of hardware components associated with a first version of the tester; and
    a second grouping of hardware components associated with a second version of the tester.

9. The testing system of claim 8, wherein the testing hardware subsystem further comprises a multiplexer coupled to the first and second groupings of hardware components, the multiplexer operable to multiplex outputs of the first and second groupings of hardware components.

10. A method for testing functional and/or operational aspects of a device under test (DUT) comprising:
    receiving specification information and testing routine information;
    processing the specification information and testing routine information in order to generate programming information;
    initializing a testing hardware subsystem using the programming information so that the testing hardware subsystem can perform testing under a plurality of testing modes, each testing mode corresponding to the operation of a particular version of a tester;
    directing the testing hardware subsystem to test under one of the plurality of testing modes at a given moment.

11. The method of claim 10, wherein the step of processing further comprises the step of tagging the specification information to the testing modes.

12. The method of claim 10, further comprising the step of querying a user to select a testing mode.

* * * * *